United States Patent
Qiu

(10) Patent No.: US 12,276,965 B2
(45) Date of Patent: Apr. 15, 2025

(54) PROCESS RECIPE, METHOD AND SYSTEM FOR GENERATING SAME, AND SEMICONDUCTOR MANUFACTURING METHOD

(71) Applicant: CHANGXIN MEMORY TECHNOLOGIES, INC., Hefei (CN)

(72) Inventor: Shaowen Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 449 days.

(21) Appl. No.: 17/660,473

(22) Filed: Apr. 25, 2022

(65) Prior Publication Data

US 2023/0221702 A1 Jul. 13, 2023

(30) Foreign Application Priority Data

Jan. 13, 2022 (CN) .......................... 202210039424.3

(51) Int. Cl.
*H01L 21/66* (2006.01)
*G03F 7/00* (2006.01)
*G05B 19/4155* (2006.01)

(52) U.S. Cl.
CPC ..... *G05B 19/4155* (2013.01); *G03F 7/70525* (2013.01); *G03F 7/70558* (2013.01); *G03F 7/70575* (2013.01); *G03F 7/70633* (2013.01); *G05B 2219/45031* (2013.01)

(58) Field of Classification Search
CPC ...... G05B 19/4155; G05B 2219/45031; G03F 7/70525; G03F 7/70558; G03F 7/70575; G03F 7/70633; G03F 7/706831; H01L 22/12; H01L 21/0274; H01L 22/20
See application file for complete search history.

(56) References Cited

U.S. PATENT DOCUMENTS 10,095,121 B2 * 10/2018 Holovinger ....... G03F 7/706831
2007/0293968 A1 * 12/2007 Fu .................... G05B 19/41875
700/121

(Continued)

FOREIGN PATENT DOCUMENTS

CN 110312967 A 10/2019
CN 112015061 A 12/2020
WO WO-2014098220 A1 * 6/2014 ......... G01N 21/8806

*Primary Examiner* — Nghia M Doan
(74) *Attorney, Agent, or Firm* — Syncoda LLC; Feng Ma

(57) ABSTRACT

Embodiments of the present disclosure relate to the field of semiconductors, and provide a process recipe, a method and a system for generating same, and a semiconductor manufacturing method. The method for generating a diffraction-based process recipe includes: providing a basic process recipe, the basic process recipe is used to form an initial alignment pattern; and performing a feedback correction step for at least one time to adjust the basic process recipe and obtain an actual process recipe, which each time includes: obtaining a first pattern and a second pattern based on the basic process recipe prior to a current feedback correction step, the first pattern is the initial alignment pattern that is developed, the second pattern is the initial alignment pattern that is etched; and adjusting the basic process recipe prior to the current feedback correction step based on a difference between the first pattern and the second pattern.

12 Claims, 3 Drawing Sheets

(56) References Cited

U.S. PATENT DOCUMENTS

2009/0319075 A1\* 12/2009 Tian .................. G01N 21/9501
                                                                                       700/121
2018/0046737 A1\* 2/2018 Willems .............. G03F 7/70683
2018/0088470 A1\* 3/2018 Bhattacharyya ........ G03F 7/705

\* cited by examiner

PROCESS RECIPE, METHOD AND SYSTEM FOR GENERATING SAME, AND SEMICONDUCTOR MANUFACTURING METHOD

CROSS-REFERENCE TO RELATED APPLICATION

This disclosure claims the priority of Chinese Patent Application No. 202210039424.3 submitted to the Chinese Intellectual Property Office on Jan. 13, 2022, the disclosure of which is incorporated herein in its entirety by reference.

TECHNICAL FIELD

Embodiments of the present disclosure relate to the field of semiconductors, and in particular, to a process recipe, a method and a system for generating same, and a semiconductor manufacturing method.

BACKGROUND

The development of semiconductor technology is usually limited by the development of photolithography. Photoetching is a process of transferring a mask pattern to a wafer by a series of steps such as exposure, development, and etching. Overlay precision is an important parameter to depict overlay accuracy of a current layer and a previous layer. Reduction of a feature size puts forward more stringent requirements on the overlay precision of the wafer. If the overlay precision between photolithographic layers does not meet design criteria, a front-end device function and a back-end wiring function will be less reliable or even fail, resulting in a direct loss of a yield of products.

To evaluate the overlay precision, an overlay mark is usually designed on the wafer. The overlay precision is obtained by comparing the overlay mark of the current layer and the overlay mark of the previous layer. Generally, the overlay marks are generated by a diffraction-based process recipe.

However, the current diffraction-based process recipe is not precise enough. Consequently, a position of the overlay mark formed based on such a process recipe deviates from design, thereby affecting the reliability of evaluating of the alignment precision based on the overlay mark.

SUMMARY

One aspect of the embodiments of the present disclosure provides a method for generating a diffraction-based process recipe. The method includes: providing a basic process recipe, where parameters in the basic process recipe include an exposure wavelength and an exposure energy, the basic process recipe is used to form an initial alignment pattern, and the initial alignment pattern corresponds to a standard overlay pattern; and performing a feedback correction step for at least one time to adjust the basic process recipe and obtain an actual process recipe, where the performing a feedback correction step each time includes: obtaining a first pattern and a second pattern based on the basic process recipe prior to a current feedback correction step, where the first pattern is the initial alignment pattern that is developed, and the second pattern is the initial alignment pattern that is etched; and adjusting the basic process recipe prior to the current feedback correction step based on a difference between the first pattern and the second pattern.

Another aspect of the embodiments of the present disclosure further provides a diffraction-based process recipe, and the diffraction-based process recipe is generated by the foregoing method for generating a diffraction-based process recipe.

Still another aspect of the embodiments of the present disclosure further provides a semiconductor manufacturing method. The semiconductor manufacturing method includes: providing a substrate; forming a patterned layer by the foregoing diffraction-based process recipe; and etching the substrate by the patterned layer as a mask to form a standard overlay pattern on the substrate.

Yet another aspect of the embodiments of the present disclosure provides a system for generating a diffraction-based process recipe. The system includes: a first obtaining device and a correction feedback device. The first obtaining device is configured to obtain a basic process recipe. Parameters in the basic process recipe include an exposure wavelength and an exposure energy. The basic process recipe is used to form an initial alignment pattern, and the initial alignment pattern corresponds to a standard overlay pattern. The correction feedback device is configured to perform a feedback correction step for at least one time to adjust the basic process recipe and obtain an actual process recipe. The performing the feedback correction step each time includes: obtaining a first pattern and a second pattern based on the basic process recipe prior to the current feedback correction step, where the first pattern is the initial alignment pattern that is developed, and the second pattern is the initial alignment pattern that is etched; and adjusting the basic process recipe prior to the current feedback correction step based on a difference between the first pattern and the second pattern.

BRIEF DESCRIPTION OF THE DRAWINGS

One or more embodiments are described illustratively by use of corresponding figures in the accompanying drawings. The illustrative description does not constitute any limitation on the embodiments. Unless otherwise expressly specified, the drawings do not constitute a scale limitation. To describe the technical solutions in the embodiments of the present disclosure or in the prior art more clearly, the following outlines the drawings to be used in the embodiments of the present disclosure. Evidently, the drawings outlined below are merely some embodiments of the present disclosure. A person of ordinary skill in the art may derive other drawings from the outlined drawings without making any creative effort.

DETAILED DESCRIPTION

As can be seen from the background, a photolithographic layer with an overlay pattern can be formed by developing the photolithographic layer based on a basic process recipe. In addition, theoretically, the overlay pattern formed by etching a wafer by the photolithographic layer with the overlay pattern as a mask is the same as the overlay pattern that is formed on the photolithographic layer by developing based on the basic process recipe. However, as affected by an actual technical process and an actual production process, a difference exists between the overlay pattern formed by developing and the overlay pattern formed by etching the photolithographic layer as a mask. Such a difference leads to a relatively large overlay error that is subsequently measured between the overlay patterns, and leads to low reliability of evaluating the alignment precision by use of the overlay pattern.

An embodiment of the present disclosure provides a method for generating a diffraction-based process recipe, in which the exposure wavelength and the exposure energy of the basic process recipe are adjusted by the feedback correction step to obtain the actual process recipe. In the feedback correction step, the exposure wavelength and the exposure energy of the basic process recipe are adjusted correspondingly based on the difference between the first pattern and the second pattern, so that the overlay pattern formed based on the actual process recipe is closer to the standard overlay pattern. To be specific, the etched initial alignment pattern is analyzed, and the basic process recipe of the initial alignment pattern is adjusted to obtain the actual process recipe, so that the overlay pattern corresponding to the actual process recipe is closer to the standard overlay pattern, thereby improving the reliability of evaluating the alignment precision by use of the overlay pattern.

The embodiments of the present disclosure are described in detail below with reference to the drawings. However, a person skilled in the art may understand that in each embodiment of this disclosure, many technical details are proposed to help readers better understand the embodiments of the present disclosure. However, the technical solutions claimed in the embodiments of the present disclosure can still be implemented even without the technical details and variations and modifications based on the following embodiments.

Figure 1:
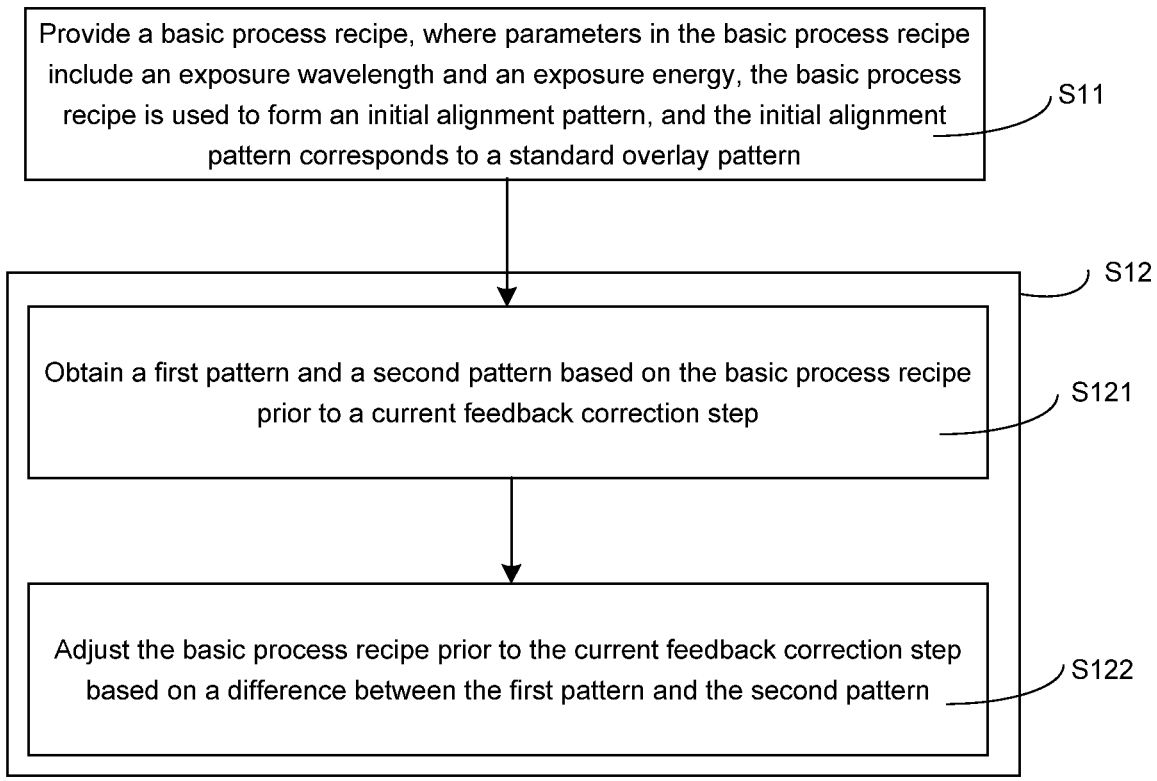
FIG. 1 is a flowchart of a method for generating a diffraction-based process recipe according to an embodiment of the present disclosure.

Referring to FIG. 1, FIG. 1 is a flowchart of a method for generating a diffraction-based process recipe according to an embodiment of the present disclosure.

In some embodiments, the method for generating a diffraction-based process recipe may include the following steps:

Step S11: Provide a basic process recipe, where parameters in the basic process recipe include an exposure wavelength and exposure energy, the basic process recipe is used to form an initial alignment pattern, and the initial alignment pattern corresponds to a standard overlay pattern.

The exposure wavelength affects a resolution of the overlay pattern formed on a photoresist layer, that is, a minimum feature size of the exposed and developed overlay pattern. In addition, theoretically, the resolution of the overlay pattern formed on the photoresist layer can be improved by reducing a wavelength of a light source.

The exposure energy is related to the size of the overlay pattern formed on the photoresist layer. Excessively low exposure energy may lead to incomplete formation of the overlay pattern. Excessively high exposure energy may lead to overetching of the photoresist layer, that is, may lead to a low precision of the overlay pattern.

Step S12: Perform a feedback correction step for at least one time to adjust the basic process recipe and obtain an actual process recipe.

In some embodiments, step S12 may include the following two substeps. S121: Obtain a first pattern and a second pattern based on the basic process recipe prior to a current feedback correction step, where the first pattern is the initial alignment pattern that is developed, and the second pattern is the initial alignment pattern that is etched. S122: Adjust the basic process recipe prior to the current feedback correction step based on a difference between the first pattern and the second pattern.

Understandably, in some embodiments, the difference between the first pattern and the standard overlay pattern may be tiny, but the etched initial alignment pattern differs greatly from the standard overlay pattern as affected by the actual technical process or the actual production. For example, the first pattern is the same as the standard overlay pattern. However, after the second pattern is formed by etching the wafer by the first pattern as a mask, the second pattern is partly abnormal. Therefore, the abnormal part of the second pattern is compensated by adjusting the basic process recipe. However, after the basic process recipe is adjusted, the pattern formed by developing based on the actual process recipe may be different from the standard pattern.

The basic process recipe is adjusted based on the difference between the first pattern and the second pattern, so that the overlay pattern corresponding to the actual process recipe is closer to the standard overlay pattern. In this way, the difference between the overlay pattern formed by the actual process recipe and the standard overlay pattern falls within a preset range.

Figure 2:
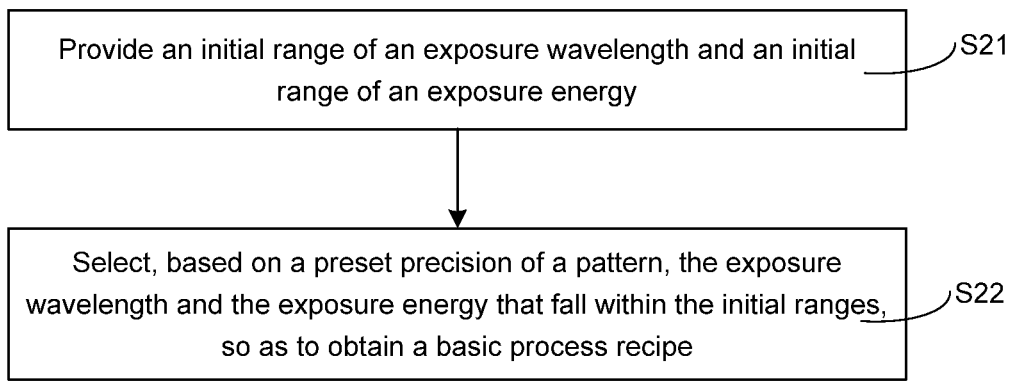
FIG. 2 is a flowchart of a method for obtaining a basic process recipe according to an embodiment of the present disclosure.

Referring to FIG. 2, FIG. 2 is a flowchart of a method for obtaining a basic process recipe according to an embodiment of the present disclosure. In some embodiments, the method for obtaining a basic process recipe includes the following steps:

S21: Provide an initial range of an exposure wavelength and an initial range of exposure energy.

Understandably, the initial range of the exposure wavelength and the initial range of the exposure energy may be provided based on the material of a photoresist layer and the thickness of the photoresist layer.

S22: Select, based on a preset precision of the pattern, the exposure wavelength and the exposure energy that fall within the initial ranges, so as to obtain a basic process recipe.

In some embodiments, a key performance indicator (KPI) curve may be obtained by simulating in software, and the exposure wavelength and exposure energy corresponding to a peak or trough of the KPI curve may be selected as a basic process recipe. By selecting the peak or trough of the KPI curve, superior exposure wavelength and exposure energy within the initial ranges can be obtained, so that a deviation between the subsequently obtained first pattern and the standard overlay pattern is smaller.

In some embodiments, the method for obtaining the basic process recipe may further include: obtaining a correspondence between the exposure wavelength and the exposure energy.

The obtained correspondence between the exposure wavelength and the exposure energy facilitates subsequent feedback correction step. The basic process recipe is adjusted based on the difference between the second pattern and the first pattern. The conception of adjusting the basic process recipe can be optimized by obtaining the correspondence between the exposure wavelength and the exposure energy first. In this way, the difference between the overlay pattern corresponding to the adjusted actual process recipe and the standard overlay pattern falls within the preset range.

Figure 3:
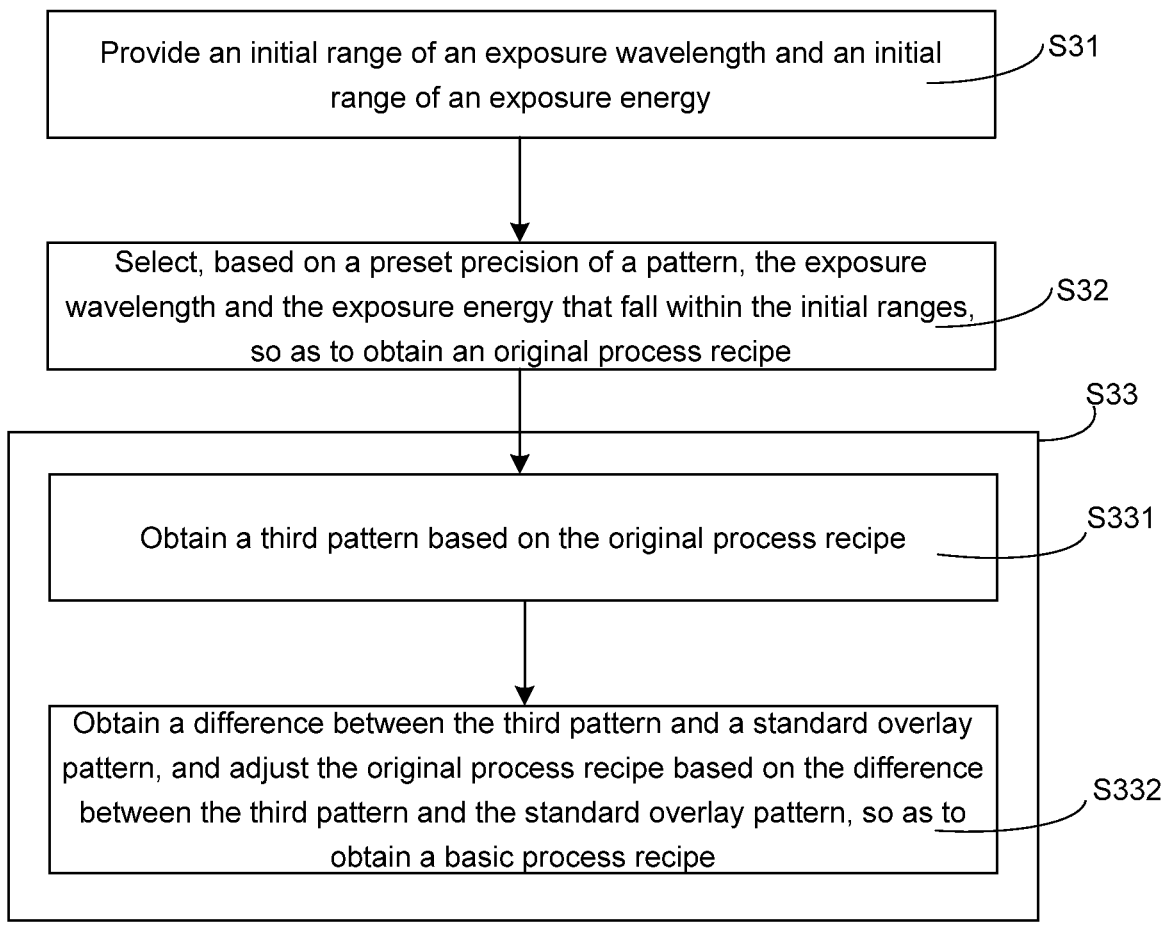
FIG. 3 is a flowchart of another method for obtaining a basic process recipe according to an embodiment of the present disclosure.

Referring to FIG. 3, FIG. 3 shows another method for obtaining a basic process recipe according to an embodiment of the present disclosure. The method includes the following steps:

S31: Provide an initial range of an exposure wavelength and an initial range of exposure energy.

Understandably, the initial range of the exposure wavelength and the initial range of the exposure energy may be provided based on the material of a photoresist layer and the thickness of the photoresist layer.

S32: Adjust, based on a preset precision of the pattern, the exposure wavelength and the exposure energy that fall within the initial ranges, so as to obtain an original process recipe.

In some embodiments, a KPI curve may be obtained by simulating in software, and the exposure wavelength and exposure energy corresponding to a peak or trough of the KPI curve may be selected as a basic process recipe. By selecting the peak or trough of the KPI curve, superior exposure wavelength and exposure energy within the initial ranges can be obtained, so that a deviation between the subsequently obtained first pattern and the standard overlay pattern is smaller.

S33: Adjust the original process recipe for at least one time. Step S33 may include the following substeps: S331: Obtaining a third pattern based on the original process recipe, where the third pattern is obtained by developing based on the original process recipe; and S332: Obtaining a difference between the third pattern and the standard overlay pattern, and adjusting the original process recipe based on the difference between the third pattern and the standard overlay pattern, so as to obtain a basic process recipe.

After the superior exposure wavelength and exposure energy are selected, the method may further include: developing a pattern corresponding to the original process recipe to obtain a third pattern; comparing the third pattern with the standard overlay pattern; and, obtaining a difference between the third pattern and the standard pattern, and adjusting the original process recipe based on the obtained difference to obtain the basic process recipe. By adjusting the selected exposure wavelength and exposure energy, a basic process recipe of a higher precision is obtained, thereby reducing the difference between the first pattern obtained based on the basic process recipe and the standard overlay pattern, and thereby reducing the range of the basic process recipe to be adjusted subsequently.

In some embodiments, the method for obtaining the basic process recipe may further include: obtaining a correspondence between the exposure wavelength and the exposure energy.

The obtained correspondence between the exposure wavelength and the exposure energy facilitates subsequent feedback correction step. The basic process recipe is adjusted based on the difference between the second pattern and the first pattern. The conception of adjusting the basic process recipe can be optimized by obtaining the correspondence between the exposure wavelength and the exposure energy first. In this way, the difference between the overlay pattern corresponding to the adjusted actual process recipe and the standard overlay pattern falls within the preset range.

In this embodiment of the present disclosure, in the method for obtaining a basic process recipe as shown in FIG. 2 in comparison with the method for obtaining a basic process recipe as shown in FIG. 3, the basic process recipe shown in FIG. 2 reduces the adjustment of the original process recipe at the time of obtaining the basic process recipe, thereby reducing one step in the entire process flow, and thereby reducing the time required for completing the entire process. In addition, a feedback correction step is performed after the basic process recipe is obtained. Therefore, the method for obtaining a basic process recipe as shown in FIG. 2 is more convenient and reduces the time length of the entire process. In the basic process recipe shown in FIG. 3, a step of adjusting the original process recipe is added, so that the adjustment range is smaller in the subsequent feedback correction step. Therefore, the overlay pattern corresponding to the actual process recipe obtained in the subsequent feedback correction step is closer to the standard overlay pattern, thereby improving the precision of the overlay pattern corresponding to the actual process recipe.

In some embodiments, the feedback correction step may be performed for at least two times. A method for adjusting the basic process recipe prior to the current feedback correction step is: in the current feedback correction step, using a basic process recipe subsequent to completion of a previous feedback correction step as the basic process recipe prior to the current feedback correction step.

In an example in which the feedback correction step is performed for two times, the two occurrences of the feedback correction step may include a first occurrence of the feedback correction step and a second occurrence of the feedback correction step in sequence. The basic process recipe adjusted in the second occurrence of the feedback correction step is based on the adjusted basic process recipe. In the second occurrence of the feedback correction step, the adjustment is performed by using the adjusted recipe in the first occurrence of the feedback correction step as a basic process recipe. Because the second occurrence of the feedback correction step is based on the basic process recipe adjusted in the first occurrence of the feedback correction step, the difference between the overlay pattern corresponding to the actual process recipe adjusted in the second occurrence of the feedback correction step and the standard overlay pattern is smaller, thereby improving the precision of the actual process recipe.

In some embodiments, a method for adjusting the basic process recipe prior to the current feedback correction step is: in the current feedback correction step, using a basic process recipe prior to a first feedback correction step as the basic process recipe.

In an example in which the feedback correction step is performed for two times, the two occurrences of the feedback correction step may include a first occurrence of the feedback correction step and a second occurrence of the feedback correction step in sequence. The basic process recipe to be adjusted in the first occurrence of the feedback correction step is a corresponding basic process recipe that has undergone no feedback correction step. The basic process recipe to be adjusted in the second occurrence of the feedback correction step is also the corresponding basic process recipe that has undergone no feedback correction step. Because the basic process recipes to be adjusted in both occurrences of the feedback correction step are the basic process recipe prior to the first occurrence of the feedback correction step, the adjustment direction of the basic process recipe may be determined by comparing the overlay patterns corresponding to the actual process recipes adjusted in the two occurrences of the feedback correction step. In addition, two control groups may be set to improve the reliability of the adjusted actual process recipe, thereby improving the precision of the overlay mark formed based on the actual process recipe, and thereby improving the reliability of evaluating the alignment precision based on the overlay mark.

The above two types of feedback correction steps may be combined. In an example in which the feedback correction step is performed for three times, the three occurrences of the feedback correction step may include a first occurrence of the feedback correction step, a second occurrence of the feedback correction step, and a third occurrence of the feedback correction step in sequence. The basic process recipes in the first occurrence of the feedback correction step and the second occurrence of the feedback correction step are the basic process recipe that has undergone no feedback correction step. A superior correction direction is obtained by comparing the overlay pattern corresponding to the actual process recipe obtained in the first occurrence of the feedback correction step with the overlay pattern corresponding to the actual process recipe obtained in the second occurrence of the feedback correction step. In an example in which the difference between the overlay pattern corresponding to the actual process recipe obtained in the first occurrence of the feedback correction step and the standard overlay pattern is smaller, the basic process recipe in the third occurrence of the feedback correction step is the actual process recipe obtained after the first occurrence of the feedback correction step. The first occurrence of the feedback correction step is further adjusted through the third occurrence of the feedback correction step, so as to obtain a more precise actual process recipe.

Understandably, the number of times of performing the feedback correction step is merely an example for ease of description, and this embodiment of the present disclosure does not limit the number of times of performing the feedback correction step. The number of times of performing the feedback correction step may be adjusted as actually required.

In some embodiments, the adjusting the basic process recipe may include: adjusting the exposure wavelength and the exposure energy. The precision of the actual process recipe can be improved by adjusting the exposure wavelength and the exposure energy of the basic process recipe.

In some embodiments, the basic process recipe further includes other influencing factors such as exposure time and ambient temperature. This embodiment of the present disclosure may further adjust other influencing factors of the basic process recipe.

In some embodiments, the adjusting the basic process recipe prior to the current feedback correction step based on a difference between the first pattern and the second pattern may include: measuring the second pattern by using a particle beam metrology tool to obtain size data of the second pattern.

Understandably, the second pattern is an initial alignment pattern that is etched. Therefore, the second pattern is measured with a particle beam metrology tool to obtain relatively precise size data of the second pattern. A process basis is provided for the feedback correction step by measuring the difference between the first pattern and the second pattern.

In some embodiments, the particle beam metrology tool may include: at least one of an electron beam metrology tool and an ion beam metrology tool.

The ion beam metrology tool is a measurement tool that measures by emitting an ion beam. The electron beam metrology tool is a measurement tool that measures by emitting an electron beam. The precision of the size data of the measured second pattern can be improved by the electron beam metrology tool or the ion beam metrology tool, so as to provide a process basis for the subsequent feedback correction step.

In some embodiments, the adjusting the basic process recipe prior to the current feedback correction step based on a difference between the first pattern and the second pattern includes: measuring the first pattern by an optical metrology tool to obtain size data of the first pattern.

Understandably, the first pattern is an initial alignment pattern that is developed. Therefore, the first pattern is measured with an optical metrology tool to obtain relatively precise size data of the first pattern. A process basis is provided for the subsequent feedback correction step by measuring the difference between the first pattern and the second pattern.

In some embodiments, the difference between the first pattern and the second pattern includes: a pattern residual between the first pattern and the second pattern. The size data at a plurality of measurement points on the first pattern and the second pattern is obtained, and the size data is compared to obtain a pattern residual. The pattern residual between the first pattern and the second pattern is compared to provide an adjustment basis for the subsequent feedback correction step.

Figure 4:
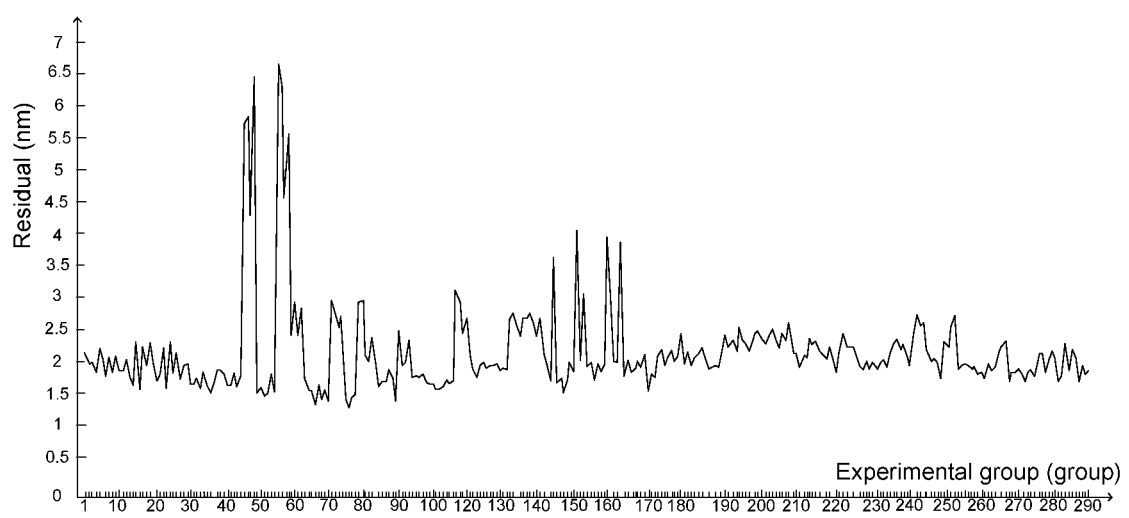
FIG. 4 is a measurement curve that shows a difference between an overlay pattern formed by an actual process recipe and a standard overlay pattern according to an embodiment of the present disclosure.

Referring to FIG. 4, FIG. 4 shows residuals between each of several groups of overlay patterns formed after the feedback correction step and a standard overlay pattern. In some embodiments, an average pattern residual that has undergone the feedback correction step in FIG. 4 can be reduced to 2 nm. The reduced pattern residual can improve the reliability of evaluating the alignment precision by use of an overlay mark.

In this embodiment of the present disclosure, parameters in the basic process recipe are adjusted. The parameters in the basic process recipe are adjusted based on the residual between the first pattern and the second pattern that correspond to the basic process recipe. The actual process recipe may be obtained through the feedback correction step. In this way, the etched pattern corresponding to the actual process recipe is closer to the standard overlay pattern, thereby improving the precision of the actual process recipe.

An embodiment of the present disclosure further provides a diffraction-based process recipe. The diffraction-based process recipe may be formed by performing all or part of the foregoing steps. The process recipe provided in this embodiment of the present disclosure is more precise.

An embodiment of the present disclosure further provides a semiconductor manufacturing method. The semiconductor manufacturing method includes: providing a substrate; forming a patterned layer by the foregoing diffraction-based process recipe; and etching the substrate by the patterned layer as a mask to form a standard overlay pattern on the substrate.

In some embodiments, the substrate may be a wafer or a die or the like.

The patterned layer may be obtained by processing a photoresist layer. The photoresist layer is processed based on the foregoing diffraction-based process recipe to form the patterned layer.

The semiconductor manufacturing method according to this embodiment of the present disclosure can form a relatively precise standard overlay pattern on the substrate.

An embodiment of the present disclosure further provides a system for generating a diffraction-based process recipe. The system may be configured to implement the foregoing method for generating a diffraction-based process recipe, and includes: a first obtaining device and a correction feedback device. The first obtaining device is configured to obtain a basic process recipe. Parameters in the basic process recipe include an exposure wavelength and an exposure energy. The basic process recipe is used to form an initial alignment pattern, and the initial alignment pattern corresponds to a standard overlay pattern. The correction feedback device is configured to perform a feedback correction step for at least one time to adjust the basic process recipe and obtain an actual process recipe. The performing the feedback correction step each time includes: obtaining a first pattern and a second pattern based on the basic process recipe prior to the current feedback correction step, where the first pattern is the initial alignment pattern that is developed, and the second pattern is the initial alignment pattern that is etched; and adjusting the basic process recipe prior to the current feedback correction step based on a difference between the first pattern and the second pattern.

The first obtaining device can obtain the exposure wavelength and the exposure energy of the basic process recipe based on the initial alignment pattern that needs to be formed. The correction feedback device can adjust the exposure wavelength and exposure energy that are obtained by the first obtaining device. The correction feedback device can obtain the first pattern and the second pattern that correspond to the basic process recipe formed by the first obtaining device, adjust the basic process recipe based on the difference between the first pattern and the second pattern, and record the adjusted actual process recipe.

The basic process recipe further includes other influencing factors such as exposure time and ambient temperature. The correction feedback device can further adjust other influencing factors of the basic process recipe.

The correction feedback device can adjust the basic process recipe obtained by the first obtaining device, so as to obtain a more precise actual process recipe. The etched alignment pattern corresponding to the actual process recipe fits in better with the standard overlay pattern. The etched alignment pattern obtained by the correction feedback device helps to measure a wafer overlay error after subsequent wafer overlay, and helps to improve the reliability of evaluating the alignment precision based on an overlay mark.

In some embodiments, the correction feedback device may include: a first test unit, configured to test a size of the first pattern; a second test unit, configured to test a size of the second pattern; and a processing unit, configured to adjust the basic process recipe based on a size difference between the first pattern and the second pattern.

Understandably, the first test unit may include an optical metrology tool. The optical metrology tool can measure the size of the first pattern, and feed back the corresponding size to the processing unit. The second test unit may include an ion beam metrology tool. The ion beam metrology tool can measure the size data of the second pattern, and feed back the corresponding size to the processing unit. The processing unit can adjust the exposure wavelength and exposure energy correspondingly by comparing the size data between the first pattern and the second pattern to obtain the actual process recipe, and can save the actual process recipe. The first test unit, the second test unit, and the processing unit can work together to obtain a more precise actual process recipe.

In this embodiment of the present disclosure, the first obtaining device and the correction feedback device work together to obtain the actual process recipe. The first obtaining device obtains the basic process recipe. The correction feedback device adjusts the basic process recipe, and compensates the basic process recipe based on the difference between the first pattern and the second pattern, so that the difference between the overlay pattern corresponding to the obtained actual process recipe and the standard overlay pattern falls within an allowable error range.

A person of ordinary skill in the art understands the above implementations are specific embodiments for implementing the present disclosure. In practical applications, various changes may be made to the above embodiments in terms of form and details without departing from the spirit and scope of the present disclosure. Any person skilled in the art may make changes and modifications to the embodiments without departing from the spirit and scope of the present disclosure. Therefore, the protection scope of the present disclosure is subject to the scope defined by the claims.

The invention claimed is:

1. A method for generating a diffraction-based process recipe, comprising:
   providing a basic process recipe, wherein parameters in the basic process recipe comprise an exposure wavelength and an exposure energy, the basic process recipe is used to form an initial alignment pattern, and the initial alignment pattern corresponds to a standard overlay pattern; and
   performing a feedback correction step for at least one time to adjust the basic process recipe and obtain an actual process recipe, wherein the performing a feedback correction step each time comprises:
   obtaining a first pattern and a second pattern based on the basic process recipe prior to a current feedback correction step, wherein the first pattern is the initial alignment pattern that is developed, and the second pattern is the initial alignment pattern that is etched; and
   adjusting the basic process recipe prior to the current feedback correction step based on a difference between the first pattern and the second pattern;
   wherein
   a method for obtaining the basic process recipe comprises:
   providing an initial range of the exposure wavelength and an initial range of the exposure energy; and
   selecting, based on a preset precision of the pattern, the exposure wavelength and the exposure energy that fall within the initial ranges, so as to obtain an original process recipe, and adjusting the original process recipe for at least one time, wherein the adjusting comprises:
   obtaining a third pattern based on the original process recipe, wherein the third pattern is obtained by developing based on the original process recipe; and
   obtaining a difference between the third pattern and the standard overlay pattern, and adjusting the original process recipe based on the difference between the third pattern and the standard overlay pattern, so as to obtain the basic process recipe.

2. The method for generating a diffraction-based process recipe according to claim 1, wherein
   a method for obtaining the basic process recipe comprises:
   providing an initial range of the exposure wavelength and an initial range of the exposure energy; and
   selecting, based on a preset precision of the pattern, the exposure wavelength and the exposure energy that fall within the initial ranges, so as to obtain the basic process recipe.

3. The method for generating a diffraction-based process recipe according to claim 2, wherein the method for obtaining the basic process recipe further comprises: obtaining a correspondence between the exposure wavelength and the exposure energy.

4. The method for generating a diffraction-based process recipe according to claim 1, wherein
the feedback correction step is performed for at least two times, and a method for adjusting the basic process recipe prior to the current feedback correction step is:
in the current feedback correction step, using a basic process recipe subsequent to completion of a previous feedback correction step as the basic process recipe prior to the current feedback correction step.

5. The method for generating a diffraction-based process recipe according to claim 1, wherein
a method for adjusting the basic process recipe prior to the current feedback correction step is: in the current feedback correction step, using a basic process recipe prior to a first feedback correction step as the basic process recipe.

6. The method for generating a diffraction-based process recipe according to claim 1, wherein
the adjusting the basic process recipe comprises: adjusting the exposure wavelength and the exposure energy.

7. The method for generating a diffraction-based process recipe according to claim 1, wherein
the adjusting the basic process recipe prior to the current feedback correction step based on a difference between the first pattern and the second pattern comprises:
measuring the second pattern by a particle beam metrology tool to obtain size data of the second pattern.

8. The method for generating a diffraction-based process recipe according to claim 7, wherein
the particle beam metrology tool comprises: at least one of an electron beam metrology tool and an ion beam metrology tool.

9. The method for generating a diffraction-based process recipe according to claim 1, wherein
the adjusting the basic process recipe prior to the current feedback correction step based on a difference between the first pattern and the second pattern comprises:
measuring the first pattern by an optical metrology tool to obtain size data of the first pattern.

10. The method for generating a diffraction-based process recipe according to claim 1, wherein
the difference between the first pattern and the second pattern comprises: a pattern residual between the first pattern and the second pattern.

11. The method for generating a diffraction-based process recipe according to claim 1, wherein
the method for obtaining the basic process recipe further comprises: obtaining a correspondence between the exposure wavelength and the exposure energy.

12. A system for generating a diffraction-based process recipe, comprising:
a first obtaining device, configured to obtain a basic process recipe, wherein parameters in the basic process recipe comprise an exposure wavelength and an exposure energy, the basic process recipe is used to form an initial alignment pattern, and the initial alignment pattern corresponds to a standard overlay pattern; and
a correction feedback device, configured to perform a feedback correction step for at least one time to adjust the basic process recipe and obtain an actual process recipe, wherein performing the feedback correction step each time comprises: obtaining a first pattern and a second pattern based on the basic process recipe prior to a current feedback correction step, wherein the first pattern is the initial alignment pattern that is developed, and the second pattern is the initial alignment pattern that is etched; and
adjusting the basic process recipe prior to the current feedback correction step based on a difference between the first pattern and the second pattern;
wherein
the correction feedback device comprises:
a first test unit, configured to test a size of the first pattern;
a second test unit, configured to test a size of the second pattern; and
a processing unit, configured to adjust the basic process recipe based on a size difference between the first pattern and the second pattern.

* * * * *